(12) United States Patent
Chen et al.

(10) Patent No.: US 6,215,113 B1
(45) Date of Patent: Apr. 10, 2001

(54) CMOS ACTIVE PIXEL SENSOR

(75) Inventors: Liang-Gee Chen; Shyh-Yih Ma, both of Taipei (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/296,897

(22) Filed: Apr. 22, 1999

(51) Int. Cl.[7] .......................... H01L 27/14; H01L 27/146
(52) U.S. Cl. .................. 250/208.1; 257/292; 348/308
(58) Field of Search ........................ 250/208.1, 214 R, 250/214 A; 257/290, 291, 292, 431, 443, 444; 348/294, 296, 301, 308

(56) References Cited

U.S. PATENT DOCUMENTS 5,962,844 * 10/1999 Merrill et al. .................... 250/208.1
6,140,630 * 10/2000 Rhodes ............................. 250/208.1

* cited by examiner

Primary Examiner—John R. Lee
Assistant Examiner—Kevin Pyo
(74) Attorney, Agent, or Firm—Fish & Richardson P.C.

(57) ABSTRACT

A CMOS active pixel sensor with motion detection includes a photo diode, a reset switch, two sample and hold circuits, and two readout circuits. Each sample and hold circuit includes a MOS switch and a capacitor. The readout circuit includes a source follower and a row select switch. The two sample and hold circuits can store current frame pixel data as well as previous frame pixel data, and these two image data can be read out by the two readout circuits. Therefore, the frame difference can be directly obtained in differential mode. This CMOS active pixel sensor can be used in single chip camera systems with motion detection and video compression functions. Furthermore, because of the low supply voltage consideration in the pixel circuit, this CMOS active pixel sensor is suitable for low power applications.

13 Claims, 4 Drawing Sheets

CMOS ACTIVE PIXEL SENSOR

FIELD OF THE INVENTION

This invention relates to semiconductor imaging devices and in particular to CMOS active pixel sensors capable of motion detection.

BACKGROUND OF THE INVENTION

Complementary metal-oxide-semiconductor (CMOS) active pixel sensor (APS) can be utilized to convert optical images into corresponding electronic signals, and can be used as the sensing part in digital still image camera systems or digital video camera systems. The main advantage of CMOS APS compared to the conventional charge-coupled device (CCD) imager is that the CMOS APS can be fabricated in standard CMOS process. Therefore, the CMOS APS imager and other CMOS circuits can be integrated into a single chip. Consequently, the cost, power consumption, and complexity of the whole system can be greatly reduced.

In many digital camera applications, motion detection is a desirable function, and especially in security applications. The simplest way to detect motion is from the difference of two consecutive image frames. Large difference between two consecutive frame means there is a motion between the images. Therefore, if the image sensor is capable of direct frame difference readout, it can be used to detect motion.

Another main application of image sensors is the digital video camera. Due to the large amount of data in video signals, video compression is essential in limited transmission bandwidth and storage size. In video signals, two consecutive image frames tend to be very similar, because a short period of time elapses therebetween, and thus the amount of information in the frame difference is much less than that in the digital camera applications. If the frame difference between two consecutive image frames in video signals can be readout directly from the image sensor, video compression can be achieved by removing the temporal redundancy.

In order to obtain the frame difference from traditional image sensors, a frame buffer is needed to store the previous frame data, and then take the difference between the current frame data and the previous frame data. In this approach, the frame buffer will occupy a large amount of chip area. If the image sensor can provide direct frame difference output, the complexity and area of the chip can be reduced.

Traditional photo diode CMOS APS can not provide frame difference directly. Photo gate APS with intra pixel charge transfer has an operating mode for frame difference output. However, when the sensor is operating in this mode, the exposure time must be the frame period, which can not be easily changed. In real applications, the environment luminance change significantly, and it is essential to effectively control the exposure time to get good quality images.

Therefore, a CMOS APS image sensor with direct frame difference output for motion detection and video compression applications and with electronic shutter to control the exposure time is desirable.

SUMMERY OF THE INVENTION

This invention proposes a CMOS APS circuit with direct frame difference output. The circuit includes a photo diode, a reset switch, two sample-and-hold circuits, and two readout circuits. Each sample-and-hold circuit includes a switch as an electronic shutter and a node for charge storage. Each readout circuit includes a MOS transistor as a source follower and a row select switch.

Since there are two sample-and-hold circuits in the CMOS APS circuit, the current frame image data and the previous frame image data can be stored in the CMOS APS circuit. The output data is read out differentially from the two readout circuits, so that the frame difference can be obtained directly. When the sensor is operated in an intra frame mode, the sample-and-hold circuit associated with the previous frame data is reset to a reference voltage, and the current frame image data can be read out from the differential readout lines.

This invention is suitable for video oriented applications such as motion detection, video compression, and moving object segmentation systems. Furthermore, low supply voltage operation has been considered in the design of the CMOS APS circuit, and it is suitable for low power applications such as portable systems.

In one embodiment of the present invention, a CMOS active pixel image sensor cell comprises:
- a photo diode including a region of a N-type conductivity formed on a P-type substrate, the P-type substrate being adapted to connect to a first power supply VSS;
- a MOS transistor as a reset switch, a gate of the MOS transistor being adapted to connect to a reset control signal, a source thereof being adapted to connect to a second power supply VDD, and a drain thereof being connected to the N-type region of the photo diode;
- two MOS transistors as electronic shutter switches, each gate of said two MOS transistors being adapted to connect to a shutter control signal, and each drain thereof is connected to the N-type region of the photo diode;
- two source follower NMOS transistors, two gates of said two source follower NMOS transistors being connected separately to two sources of said two MOS transistors, and two drains of said two source follower NMOS transistors being adapted to connect to VDD; and
- two switch NMOS transistors as row select switches, two drains of said two switch NMOS transistors being connected separately to two sources of said two source follower NMOS transistors, both gates of said two switch NMOS transistors being adapted to connect to a row select signal, and each source of said two switch NMOS transistors being an output node.

The active pixel image sensor cell may further comprises two capacitors, two terminals of the two capacitors are connected separately to said two gates of said two source follower transistors, and another two terminals of said two capacitors are connected to a fixed voltage.

Preferably, said two capacitors are two NMOS transistors, two gates of said two NMOS transistors are connected separately to said two gates of said two source follower transistors, two sources and two drains of said two NMOS transistors are all adapted to connected to VSS.

Preferably, the reset switch and the electronic shutter switches in the active pixel image sensor cell are PMOS transistors.

In another embodiment of the present invention, a CMOS active pixel image sensor cell comprises:
- a photo diode including a region of a P-type conductivity formed on a N-type well region, the N-type well region being adapted to connect to a first power supply VDD;
- a MOS transistor as a reset switch, a gate of the MOS transistor being adapted to connect to a reset control signal, a source thereof being adapted to connect to a second power supply VSS, and a drain thereof being connected to the P-type region of the photo diode;

two MOS transistors as electronic shutter switches, each gate of said two MOS transistors being adapted to connect to a shutter control signal, and each drain thereof is connected to the P-type region of the photo diode;

two source follower PMOS transistors, two gates of said two source follower PMOS transistors being connected separately to two sources of said two MOS transistors, and two drains of said two source follower PMOS transistors being adapted to connect to VSS; and two switch PMOS transistors as row select switches, two drains of said two switch PMOS transistors being connected separately to two sources of said two source follower PMOS transistors, both gates of said two switch PMOS transistors being adapted to connect to a row select signal, and each source of said two switch PMOS transistors being an output node.

The active pixel image sensor cell constructed according to the another embodiment of the present invention may further comprises two capacitors, two terminals of the two capacitors are connected separately to said two gates of said two source follower transistors, and another two terminals of said two capacitors are connected to a fixed voltage. Preferably, said two capacitors are two PMOS transistors, two gates of said two PMOS transistors are connected separately to said two gates of said two source follower transistors, two sources and two drains of said two PMOS transistors are all adapted to connected to VDD.

Preferably, the reset switch and the electronic shutter switches in the active pixel image sensor cell constructed according to the another embodiment of the present invention are NMOS transistors.

The present invention also provides a CMOS active pixel sensor array comprising:

a plurality of the active pixel sensors of the present invention arranged into a main sensor array having n rows and m columns (n and m are an integer greater than 1); and m active pixel sensors arranged into a reference sensor row, each of the active pixel image sensors in the reference sensor row being the same as the active pixel image sensor in the main sensor array except that the photo diode is shielded to avoid incident light; wherein active pixel sensors in the same row are connected together and are connected to a row decoder, so that the gate of the reset switch of each active pixel sensor in the same row is adapted to connect to the reset control signal, said two gates of said electronic shutter switches of each active pixel sensor in the same row are adapted to separately connect to the two shutter control signals, said two gates of said row select switches of each active pixel sensor in the same row are adapted to connect to said row select signal; and active pixel sensors in the same column are connected together, so that the two output nodes of each active pixel sensor in the same column are separately connected to a column decoder via a pair of differential signal lines.

The present invention further provides a method for generating an image frame signal by using the CMOS active pixel sensor of the present invention comprising the steps of:

generating a reset control signal to close the reset switch and generate two shutter control signals to close the electronic shutter switches to initiate a reset process;

generating a reset control signal to open the reset switch, and generating two shutter control signals to close one of the electronic shutter switches and open the other electronic shutter switch, so that a photo current integration process is started and maintained for a predetermined period of time;

generating two shutter control signals to open both of the electronic shutter switches and generating a row select control signal to close both of the row select switches, so that a readout process is carried out; and generating a row select control signal to open both of the row select switches and thus the readout process is ended.

The present invention further provides a method for generating a frame difference signal of two consecutive image frames by using the CMOS active pixel sensor of the present invention, which comprises the steps of:

generating a reset control signal to close the reset switch and generating two shutter control signals to close one of the electronic shutter switches and to open the other electronic shutter switch, so that a reset process is initiated;

generating a reset control signal to open the reset switch, so that a photo current integration process is started and maintained for a predetermined period of time;

generating two exposure control signals to open both of the electronic shutter switches and generating a row select control signal to close both of the row select switches, so that a readout process is carried out;

generating a row select control signal to open both of the row select switches, so that the readout process is ended;

generating a reset control signal to close the reset switch and generate two shutter control signals to open one of the electronic shutter switches and to close the other electronic shutter switch, so that the reset process is initiated;

generating a reset control signal to open the reset switch, so that the photo current integration process is started and maintained for a predetermined period of time;

generating two shutter control signals to open both of the electronic shutter switches and generating a row select control signal to close both of the row select switches, so that the readout process is carried out; and generating a row select control signal to open both of the row, select switches, so that the readout process is ended.

DETAILED DESCRIPTION OF THE INVENTION

Figure 1:
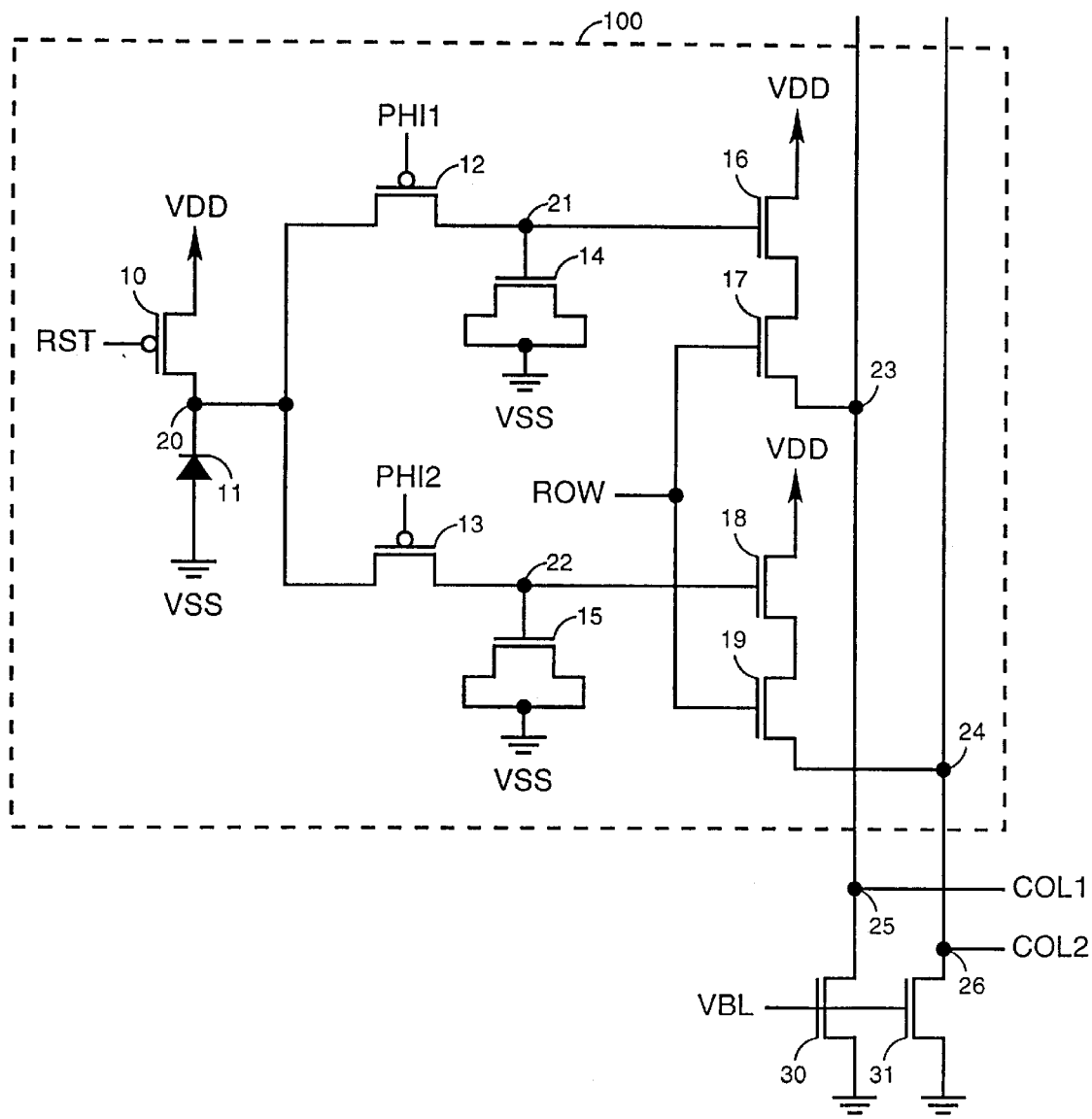
FIG. 1 is a circuit diagram illustrating a CMOS active pixel sensor with direct frame difference output of the present invention.

FIG. 1 is a schematic circuit diagram of a CMOS APS cell 100 with direct frame difference output constructed according to one of the preferred embodiments of the present invention. It includes a photo diode 11, a reset switch 10 (a P-type MOSFET), two sample-and-hold circuits, and two readout circuits. Each sample-and-hold circuit includes a P-type MOSFET 12 (13) as an electronic shutter, a charge storage node 21 (22). Each readout circuit includes an N-type MOSFET 16 (18) as a source follower, and an N-type MOSFET 17 (19) as a row select switch. The capacitance at the charge storage nodes 21,22 can be increased by connecting thereto N-type MOSFET capacitors 14,15 or other types of capacitors.

Figure 2:
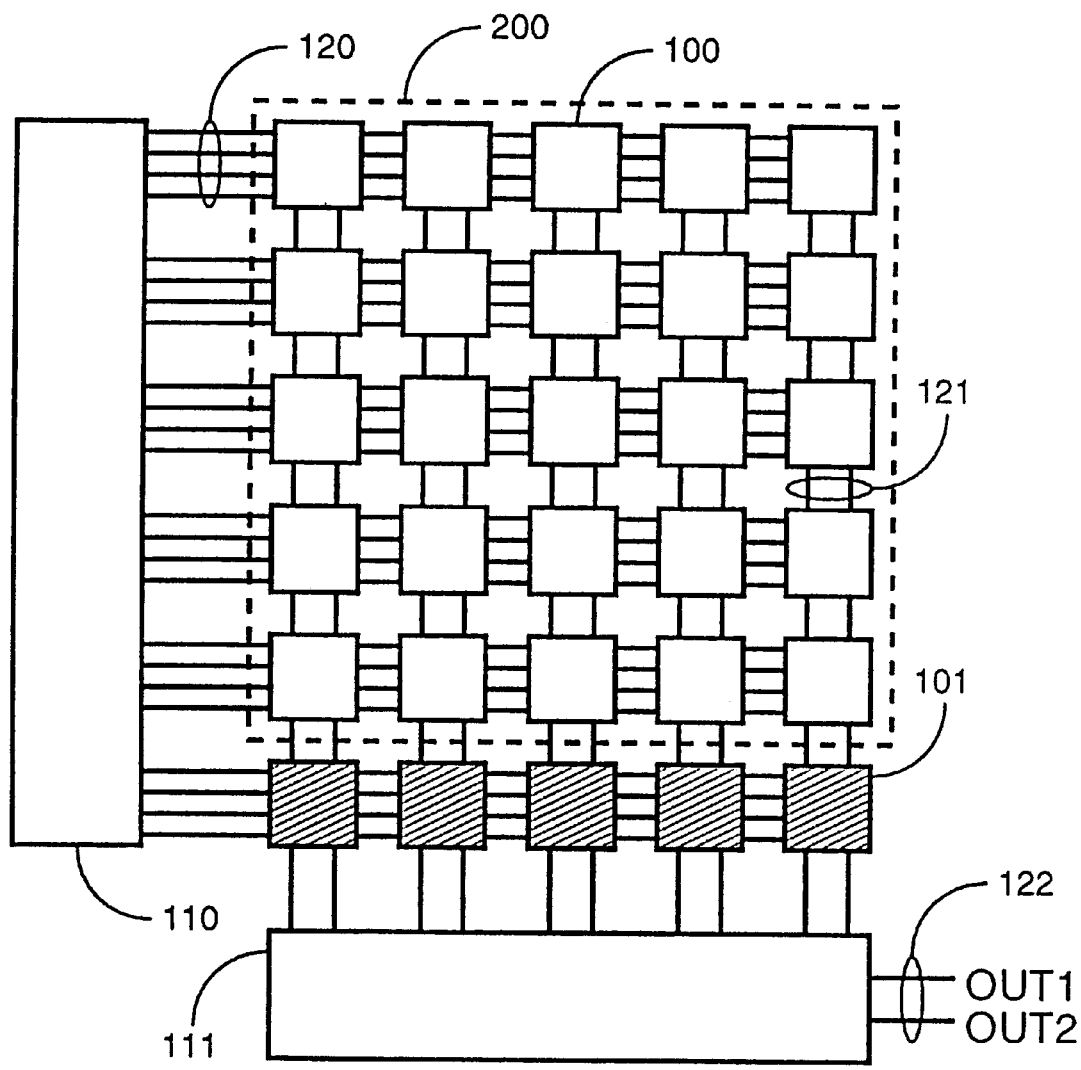
FIG. 2 is a block diagram of an image sensing CMOS APS array of the present invention.

In digital camera or video camera applications, the image sensing part is a focal plane array of the CMOS APS cells 100. FIG. 2 shows an example of 5×5 focal plane array 200 of the CMOS APS cells 100 shown in FIG. 1. As shown in FIGS. 1 and 2, the APS cells 100 in the same row of the array 200 are connected together and connected to a row decoder 110 with four control signal lines (RST, PHI1, PHI2, ROW) 120. The gate of the reset switch 10 of each APS cell 100 in the same row is connected to a reset control signal RST, the two gates of said electronic shutter switches 12,13 of each APS cell 100 in the same row are separately connected to two shutter control signals PHI1,PHI2, the two gates of said row select switches 17,19 of each APS cell 100 in the same row are connected to a row select signal ROW. The row decoder decodes the addresses and controls the timing of reset, exposure, and readout.

The two source nodes 23,24 of the row select switches 17,19 of the APS cells in a column are separately connected together to form two differential output nodes COL1,COL2 of this column via a pair of differential signal lines 121. Two current sources formed by two N-type MOSFET transistors 30,31 are connected separately to the two differential output nodes in each column, and act as the load of the source followers 16,18 in the cell. The gates of the load MOSET transistors 30,31 are connected to a fixed voltage VBL, and the drains 25,26 thereof are separately connected the two differential output nodes COL1,COL2 of the column. Two differential output nodes COL1,COL2 of each column are connected to a column decoder 111 via two differential signal lines 121. The column decoder including the load MOSET transistors 30,31 for the differential output nodes COL1,COL2, an address decoder, a timing control circuit, and a readout circuit. The image data of the APS cell selected by the address decoder can be read out differentially from two output nodes OUT1 and OUT2 via lines 122.

In addition to the sensor array 200, a row 101 of CMOS APS cells may be added to reduce the fixed pattern noise caused by process variation. Each of the CMOS APS cells of this additional row 101 is the same as the CMOS APS cells in the array 200 except that the photo diode area thereof is covered by a metal layer to block the incident light. Therefore, the readout signals of the pixels in this additional row 101 should be fixed signals after the reset process and should be independent of the incident light. When an image signal of a selected APS cell is read out, a signal of the shielded APS cell in the same column with the selected APS cell is also read out. The final image signal is the difference of these two signals. Since these two readout values pass through the same readout circuit, the effect of process variation can be cancelled by this double sampling technique, and the fixed pattern noise can be reduced.

Figure 3:
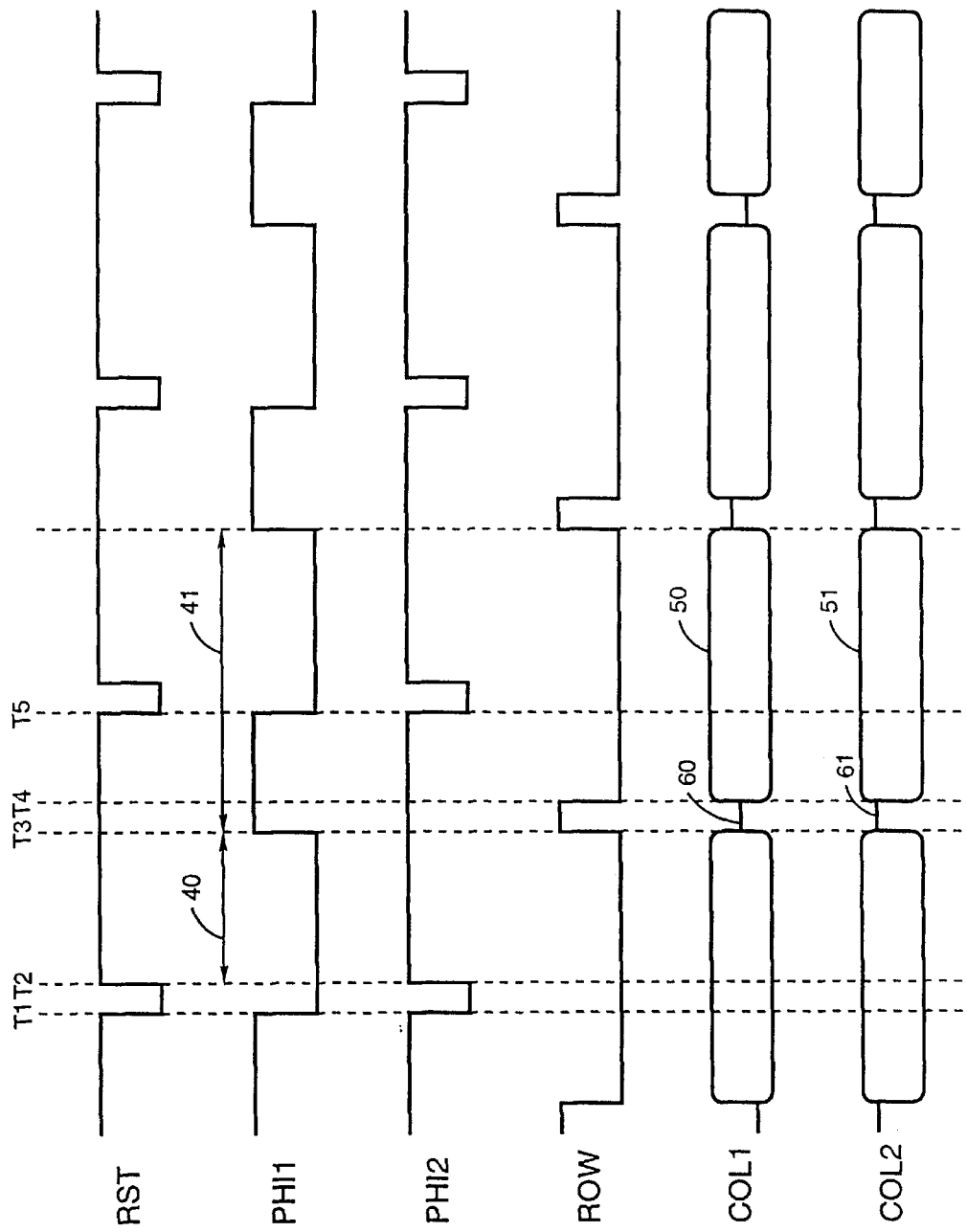
FIG. 3 is a timing diagram of the CMOS APS shown in FIG. 1 operated in intra frame mode.

FIG. 3 is the timing diagram of the CMOS APS of FIG. 1 operating in an intra frame mode. The reset period begins at time T1, when the reset control signal RST is in a low voltage state to close the reset switch 10. The shutter control signals PHI1 and PHI2 are in low voltage state at the same time to close the shutter switches 12 and 13. The cathode 20 of the photo diode 11 and two charge storage nodes 21 and 22 are charged to the power supply voltage VDD through the reset switch 10.

At time T2, the reset control signal RST is in a high voltage state to open the reset switch 10 and ends the reset period. The shutter control signal PHI2 is in a high voltage state at the same time to open the electronic shutter switch 13. Since the shutter switch 13 is open, the charge storage node 22 is not connected to the photo diode 11, and thus the voltage at this node will not be affected by the photo current generated by incident light and will be kept at the reset voltage VDD. However, the PHI1 signal is still in the low voltage state, so that the electronic shutter switch 12 controlled by PHI1 is closed. The photo current integration period begins. The electron-hole pairs generated by incident light in the depletion region of the photo diode cause a photo current which is in proportion to the incident light power. This photo current will discharge the depletion capacitor and the sampling capacitor 14 connected to the node 21. The voltage at node 21 is equal to the voltage at the cathode 20 of the photo diode because the shutter switch 12 remains close. The voltage drop at the node 21 during the photo current integration period 40 is proportional to the total energy of incident light during this period.

At time T3, the PHI1 signal is in a high voltage state to open the electronic shutter switch 12 controlled by PHI1, and the photo current integration period ends. The voltage at the node 22 is VDD, and the voltage at the node 21 is VDD minus the voltage drop caused by incident light. Therefore, the voltage difference of the nodes 21 and 22 contains the information of the total incident energy of this cell during the photo current integration period 40. The row select control signal ROW is in a high voltage state at this time to close the two row select switches 17 and 19. The image information can be read out differentially from the output nodes COL1 and COL2 through the two source followers 16 and 18. The voltage signal 60 at COL1 contains the image information and the voltage signal 61 at COL2 is an output voltage of the source follower 18 with the reset voltage VDD at the input.

At time T4, the ROW signal is in a low voltage state to open the two row select switches 17 and 19, and the readout operation ends. At this time, the output nodes COL1 and COL2 are disconnected with this APS cell and can be used to read out other pixels 50,51. At time T5, the state of the control signals are the same as at time T1, the reset period of the next image frame begins. This timing pattern is repeated continuously for video sequence capturing.

In this mode, the period 41 of the ROW signal is the frame period, which is set by the application and can not be easily changed. However, the exposure time 40 is subjected to change independently from the frame period 41 by adjusting the timing of RST, PHI1 and PHI2 signals. Consequently, a clear image can be captured under different luminance conditions by adjusting the exposure time.

Figure 4:
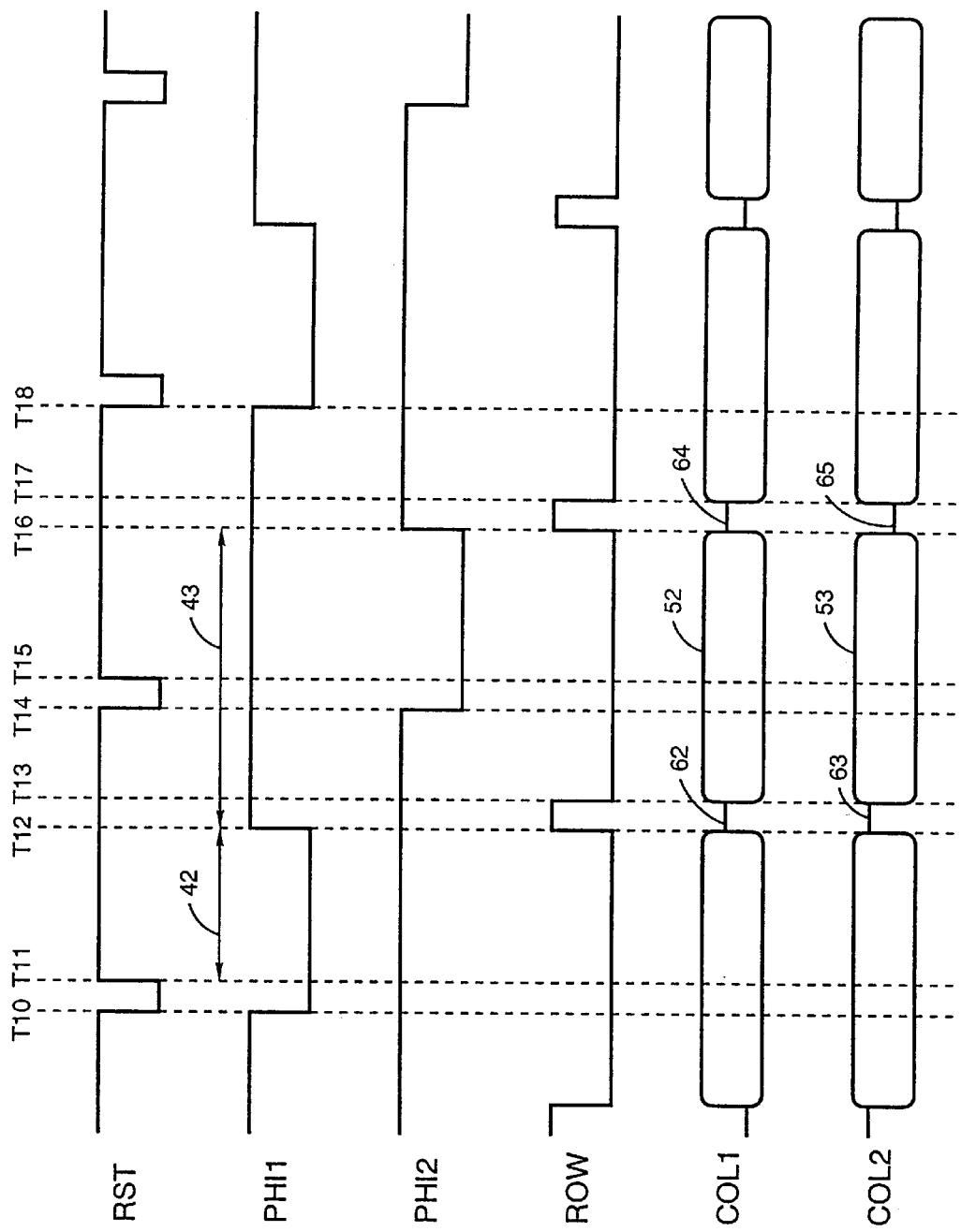
FIG. 4 is a timing diagram of the CMOS APS shown in FIG. 1 operated in frame difference mode.

FIG. 4 shows the timing diagram of the CMOS APS shown in FIG. 1 operating in a frame difference mode. The reset period begins at time T10, the reset control signal RST is in a low voltage state to close the reset switch 10. The shutter control signal PHI1 is in a low voltage state to close the electronic shutter switch 12 controlled by PHI1. The voltage at the node 21 is reset to the power supply voltage VDD through the shutter switch 12 and the reset switch 10. At the same time, the PHI2 signal is in a high voltage state and causes the shutter switch 13 to open, so that the charge signal stored at node 22 is not affected in the reset process.

At time T11, the reset control signal RST is in a high voltage state to open the reset switch 10. The shutter control signal PHI1 is still in the low voltage state at this time and the electronic shutter switch 10 is remained close. The reset period ends and the photo current integration period begins. The voltage drop at node 21 during this period contains the information of the total incident light energy. Since the PHI2 signal is in the high voltage state, the shutter switch 13 is open and the charge signal stored at node 22 will not be affected by the photo current integration operation.

At time T12, PHI1 signal is in a high voltage state to open the electronic shutter switch 12 controlled by PHI1, and thus the photo current integration period ends. The exposure time 42 is the photo current integration time from T11 to T12. The row select control signal ROW is in a high voltage state at time T12, so that the two row select switches 17 and 19 are closed. The frame difference information 62,63 can be obtained differentially from the two output nodes COL1 and COL2 through the two source followers 16 and 18. Where the output signal 62 at COL1 contains image information of the current frame and the output signal 63 at COL2 contains image information of the previous frame stored in the APS cell. Therefore, the frame difference can be read out directly from the differential output nodes.

At time T13, the ROW signal is in a low voltage state to open the two row select switch 17 and 19 and the readout period ends. The differential output nodes COL1 and COL2 are now disconnected to this pixel and can be used to read out other pixels.

At time T14, the reset control signal RST is in the low voltage state to close the reset switch 10 and the reset process begins. In contrast with the operation at T10, the PHI1 signal is still in the high voltage state and the PHI2 signal is in the low voltage state. The reset process will not affect the voltage at the node 21; however, the voltage at the node 22 will be set to the reset voltage VDD through the electronic shutter switch 13. At time T15, the RST signal is in the high voltage state. The reset period ends and the photo current integration period begins. The voltage at the node 21 will not be affected by the incident light, but the voltage at the node 22 will be decreased with the total incident light energy.

At time T16, PHI2 signal is in the high voltage state to open the electronic shutter switch 13. The exposure period ends. The ROW signal is in the high voltage state to close the row select switches 17 and 19. The image can be read out from the differential output nodes COL1 and COL2 through the two source followers 16 and 18. The voltage signal 64 at COL1 is the previous frame image signal 62 because the electronic shutter switch 12 is open in the entire frame period. However, the voltage signal 65 at COL2 contains the current frame image signal. The difference of the two differential output signal is the difference of the two consecutive frames.

At time T17, the ROW signal is in the low voltage state, the readout period ends. The row select switches 17 and 19 are open and the output nodes COL1 and COL2 are ready for the readout process of other APS cells. At time T18, another reset process begins, and all the signal states are the same as at time T10. This timing pattern is repeated for continuous frame difference output.

As shown in FIG. 4, the operation of frame difference mode is to control the two shutter control signals PHI1 and PHI2, so that the two shutter switches 12 and 13 are alternatively turned on. Since the current frame image data as well as the previous frame image data are stored in the APS cell, the frame difference output can be obtained continuously.

In FIG. 1, the reset switch 10 and the electronic shutter switches 12 and 13 are P-type MOSFET, so that the voltage at the nodes 21 and 22 can achieve the power supply voltage VDD during the reset process. If N-type MOSFET are used in these three switches, the reset voltage at the nodes 21 and 22 will be a threshold voltage lower than the power supply voltage VDD. This is because the N-type MOSFET can not be fully turned on with high voltage signals. As a result, the output voltage range will decrease by a threshold voltage of an N-type MOSFET. In low power applications, the supply voltage is usually low and this output voltage range decrease can significantly degrade the signal-to-noise ratio. Therefore, we use P-type MOSFET as the reset and shutter switches so that the pixel circuit have larger output voltage range and is suitable for low supply voltage applications.

In the above discussion, the photo diode 11 is an N-type diffusion on P-type substrate. If the photo diode is an P-type diffusion on N-well, the same circuit can still be applied but the polarity of all transistors and supply voltage should be changed accordingly.

We claim:

1. A CMOS active pixel image sensor cell comprising:
    a photo diode including a region of a N-type conductivity formed on a P-type substrate, the P-type substrate being adapted to connect to a first power supply VSS;
    a MOS transistor as a reset switch, a gate of the MOS transistor being adapted to connect to a reset control signal, a source thereof being adapted to connect to a second power supply VDD, and a drain thereof being connected to the N-type region of the photo diode;
    two MOS transistors as electronic shutter switches, each gate of said two MOS transistors being adapted to connect to a shutter control signal, and each drain thereof is connected to the N-type region of the photo diode;
    two source follower NMOS transistors, two gates of said two source follower NMOS transistors being connected separately to two sources of said two MOS transistors, and two drains of said two source follower NMOS transistors being adapted to connect to VDD; and
    two switch NMOS transistors as row select switches, two drains of said two switch NMOS transistors being connected separately to two sources of said two source follower NMOS transistors, both gates of said two switch NMOS transistors being adapted to connect to a row select signal, and each source of said two switch NMOS transistors being an output node.

2. The active pixel image sensor cell according to claim 1 further comprising two capacitors, wherein two terminals of the two capacitors are connected separately to said two gates of said two source follower transistors, and another two terminals of said two capacitors are connected to a fixed voltage.

3. The active pixel image sensor cell according to claim 2, wherein said two capacitors are two NMOS transistors, two gates of said two NMOS transistors are connected separately to said two gates of said two source follower transistors, two sources and two drains of said two NMOS transistors are all adapted to connect to VSS.

4. The active pixel image sensor cell according to claim 1, wherein the reset switch is a PMOS transistor.

5. The active pixel image sensor cell according to claim 1, wherein the electronic shutter switches are PMOS transistors.

6. A CMOS active pixel image sensor cell comprising:
    a photo diode including a region of a P-type conductivity formed on a N-type well region, the N-type well region being adapted to connect to a first power supply VDD;

a MOS transistor as a reset switch, a gate of the MOS transistor being adapted to connect to a reset control signal, a source thereof being adapted to connect to a second power supply VSS, and a drain thereof being connected to the P-type region of the photo diode;

two MOS transistors as electronic shutter switches, each gate of said two MOS transistors being adapted to connect to a shutter control signal, and each drain thereof is connected to the P-type region of the photo diode;

two source follower PMOS transistors, two gates of said two source follower PMOS transistors being connected separately to two sources of said two MOS transistors, and two drains of said two source follower PMOS transistors being adapted to connect to VSS; and two switch PMOS transistors as row select switches, two drains of said two switch PMOS transistors being connected separately to two sources of said two source follower PMOS transistors, both gates of said two switch PMOS transistors being adapted to connect to a row select signal, and each source of said two switch PMOS transistors being an output node.

7. The active pixel image sensor cell according to claim 6 further comprising two capacitors, wherein two terminals of the two capacitors are connected separately to said two gates of said two source follower transistors, and another two terminals of said two capacitors are connected to a fixed voltage.

8. The active pixel image sensor cell according to claim 7, wherein said two capacitors are two PMOS transistors, two gates of said two PMOS transistors are connected separately to said two gates of said two source follower transistors, two sources and two drains of said two PMOS transistors are all adapted to connect to VDD.

9. The active pixel image sensor cell according to claim 6, wherein the reset switch is a NMOS transistor.

10. The active pixel image sensor cell according to claim 6, wherein the electronic shutter switches are NMOS transistors.

11. A CMOS active pixel sensor array comprising:

a plurality of the active pixel sensors according to any one of claims 1 to 10 arranged into a main sensor array having n rows and m columns, n and m being an integer greater than 1; and m active pixel sensors arranged into a reference sensor row, each of the active pixel image sensors in the reference sensor row being the same as the active pixel image sensor in the main sensor array except that the photo diode is shielded to avoid incident light; wherein active pixel sensors in the same row are connected together and are connected to a row decoder, so that the gate of the reset switch of each active pixel sensor in the same row is adapted to connect to the reset control signal, said two gates of said electronic shutter switches of each active pixel sensor in the same row are adapted to separately connect to the two shutter control signals, said two gates of said row select switches of each active pixel sensor in the same row are adapted to connect to said row select signal; and active pixel sensors in the same column are connected together, so that the two output nodes of each active pixel sensor in the same column are separately connected to a column decoder via a pair of differential signal lines.

12. A method for generating an image frame signal by using the CMOS active pixel sensor according to claim 1, said method comprising the following steps:

generating a reset control signal to close the reset switch and generate two shutter control signals to close the electronic shutter switches to initiate a reset process;

generating a reset control signal to open the reset switch, and generating two shutter control signals to close one of the electronic shutter switches and open the other electronic shutter switch, so that a photo current integration process is started and maintained for a predetermined period of time;

generating two shutter control signals to open both of the electronic shutter switches and generating a row select control signal to close both of the row select switches, so that a readout process is carried out; and generating a row select control signal to open both of the row select switches and thus the readout process is ended.

13. A method for generating a frame difference signal of two consecutive image frames by using the CMOS active pixel sensor according to claim 1, which comprises the following steps:

generating a reset control signal to close the reset switch and generating two shutter control signals to close one of the electronic shutter switches and to open the other electronic shutter switch, so that a reset process is initiated;

generating a reset control signal to open the reset switch, so that a photo current integration process is started and maintained for a predetermined period of time;

generating two exposure control signals to open both of the electronic shutter switches and generating a row select control signal to close both of the row select switches, so that a readout process is carried out;

generating a row select control signal to open both of the row select switches, so that the readout process is ended;

generating a reset control signal to close the reset switch and generate two shutter control signals to open one of the electronic shutter switches and to close the other electronic shutter switch, so that the reset process is initiated;

generating a reset control signal to open the reset switch, so that the photo current integration process is started and maintained for a predetermined period of time;

generating two shutter control signals to open both of the electronic shutter switches and generating a row select control signal to close both of the row select switches, so that the readout process is carried out; and generating a row select control signal to open both of the row select switches, so that the readout process is ended.

* * * * *